US006185511B1

(12) United States Patent
Steffan et al.

(10) Patent No.: US 6,185,511 B1
(45) Date of Patent: Feb. 6, 2001

(54) METHOD TO ACCURATELY DETERMINE CLASSIFICATION CODES FOR DEFECTS DURING SEMICONDUCTOR MANUFACTURING

(75) Inventors: Paul J. Steffan, Elk Grove; Ming Chun Chen, Milpitas, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 08/979,629

(22) Filed: Nov. 28, 1997

(51) Int. Cl.[7] .................................................. G06F 19/00
(52) U.S. Cl. ............................ 702/81; 702/83; 702/84; 700/109; 700/110; 700/116; 700/121
(58) Field of Search .......................... 702/81–84, 33–36, 702/40, 108, 113–115, 117–123, 179, 180, 159, 172, 183–185, FOR 155, FOR 139, FOR 135–FOR 137, FOR 123–FOR 125, FOR 170, FOR 171; 700/109, 110, 115–121; 438/10–12, 14–18; 382/149, 141, 144, 145, 152, 224; 348/125, 126, 129, 130; 356/237.2, 237.4; 324/537, 764–769; 209/571–573

(56) References Cited

U.S. PATENT DOCUMENTS

| 5,095,447 | * | 3/1992 | Manns et al. ......................... 382/144 |
| 5,544,256 | * | 8/1996 | Brecher et al. ....................... 382/149 |
| 5,787,190 | * | 7/1998 | Peng et al. ............................ 382/145 |
| 5,808,735 | * | 9/1998 | Lee et al. ........................... 356/237.2 |
| 5,862,055 | * | 1/1999 | Chen et al. ........................... 700/121 |

\* cited by examiner

*Primary Examiner*—Hal Wachsman
(74) *Attorney, Agent, or Firm*—H. Donaldson Nelson

(57) ABSTRACT

A method of determining classification codes for defects occurring in semiconductor processes comparing images of defects from a first selected wafer with images of defects in a first image reference library. The images in the first image reference library are updated from a master image reference library. The images in the master image reference library are the best images of defect types. The images in the master image reference library are in a format readable by all review stations utilized to review the images of the defect.

4 Claims, 3 Drawing Sheets

METHOD TO ACCURATELY DETERMINE CLASSIFICATION CODES FOR DEFECTS DURING SEMICONDUCTOR MANUFACTURING

BACKGROUND OF THE INVENTION

1. Field of the Invention

This invention relates generally to a defect classification methodology in a semiconductor manufacturing testing system. More specifically, this invention relates to an automatic defect classification methodology that stores the most ideal images for each type of defect in a master library of images. Even more specifically, this invention relates to an automatic defect classification methodology that stores the most ideal images for each type of defect in a master library of images that is accessible and readable by any type of automatic defect classification system.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As is known in the semiconductor manufacturing art, the yield of chips (also know as die) from each wafer is not 100% because of defects to die during the manufacturing process. The number of good chips obtained from a wafer determines the yield. As can be appreciated, chips that must be discarded because of a defect increases the cost of the remaining usable chips.

A single semiconductor chip can require numerous process steps such as oxidation, etching, metallization, ion implantation, thermal annealing, and wet chemical cleaning. These are just a few of the many types of process steps involved in the manufacture of a semiconductor chip. Some of these process steps involve placing the wafer on which the semiconductor chips are being manufactured into different tools during the manufacturing process. The optimization of each of these process steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits. A major part of the analysis process is to determine if defects are caused by one of the process tools, and if so, which tool caused the defects.

As the wafer is placed into different tools during manufacture, each of the tools can produce different types of particles that drop onto the wafer and cause defects that have the potential to "kill" a die and decrease the yield. In order to develop high yield semiconductor processes and to improve existing ones, it is important to identify the sources of the various particles that cause defects and then to prevent the tools from dropping these particles onto the wafer while the wafers are in the tools.

In order to be able to quickly resolve process or equipment issues in the manufacture of semiconductor products, a great deal of time, effort and money are being expended by semiconductor manufacturers to capture and classify defects encountered in the manufacture of semiconductor products. Once a defect is detected, properly described, and classified, effort can begin to resolve the cause of the defect and to eliminate the cause of the defect. The biggest problem that faced the semiconductor manufacturers and one of the most difficult to solve was the problem associated with the training and maintenance of a cadre of calibrated human inspectors who can classify all types of defects consistently and without error. This problem was mainly caused by unavoidable human inconsistency and as a solution to this problem, Automatic Defect Classification (ADC) systems were developed.

One such system for automatically classifying defects consists of the following methodological sequence. Gather a defect image from a review station. View the defect image and assign values to elemental descriptor terms called predicates that are general descriptors such as roundness, brightness, color, hue, graininess, etc. Assign a classification code to the defect based upon the values of all the predicates. A typical ADC system could have 40 or more quantifiable qualities and properties that can be predicates. Each predicate can have a specified range of values and a typical predicate can have a value assigned to it between 1 and 256. The range of values that can be assigned to a predicate is arbitrary and can be any range of values. In this example, a value of 1 could indicate that none of the value is present and a value of 256 would indicate that the quality represented by the predicate is ideal. For example, a straight line would have a value of 1 for the predicate indicating roundness, whereas a perfect circle would have a value of 256 for the same predicate. The classification code for each defect is determined by the system from the combination of all the predicate values assigned to the defect. The goal of the ADC system is to be able to uniquely describe all the defect types, in such a manner that a single classification code can be assigned to a defect that has been differentiated from all other types of defects. This is accomplished by a system administrator who trains an artificial intelligence system to recognize various combinations and permutations of the 40 or more predicates to assign the same classification code to the same type of defect. This would result in a highly significant statistical confidence in the probability that the defect, and all other defects of the same type or class, will always be assigned the same classification code by the ADC system. This is done by performing a "best-fit" calculation against all assigned classification codes. If the fit is not good enough, the system will assign an "unknown" code, which means the system needs further training for that device/layer/defect. Once the classification code for a particular defect is determined and assigned, the predicate values that pertain to that defect and which were used to determine the classification code are not saved. In most cases, the only value saved in the database is the classification code. In rare instances, the image of the defect is saved. For these early ADC systems, it was found that if the classification codes needed to be modified to further differentiate between defects it could not be done because none of the information necessary to determine new classification codes was available. The only times the classification codes could be modified were the rare cases in which the image of the defect was preserved.

However, another problem soon emerged. This problem is that the classification codes were tool dependent. The classification codes are determined by predicates, however, the predicates are unique to each tool and the associated ADC system that detects, assigns values to the predicates, and assigns a classification code to each defect. As the manufacturing process becomes more complex, different tools are utilized to detect defects and assign classification codes to the defects. Because the predicates are unique to each tool, the accumulated knowledge in each tool/ADC system is only usable by that tool/ADC system. Each new tool whether it is a new model from the same manufacturer or a new tool from a different manufacturer may have different predicates that need to be calibrated.

Therefore, what is needed is a methodology that utilizes common defect information that is accessible and usable by all tools.

SUMMARY OF THE INVENTION

A method of determining classification codes for defects occurring in semiconductor manufacturing processes in accordance with the present invention solves the above and other problems associated with determining classification codes for defects by comparing images of the defects on a wafer with images of defects in an image reference library.

The above and other objects and advantages of the present invention are attained with a master image reference library in which images for defect types are stored. These defect images are used to update individual image reference libraries associated with individual scanning and imaging tools. The updated defect images from the individual image reference libraries are used to compare with images of defects that are detected on wafers from a production lot. When there is a match between an image from a detected defect and an image in the individual image reference library a classification code can be assigned to the defect.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
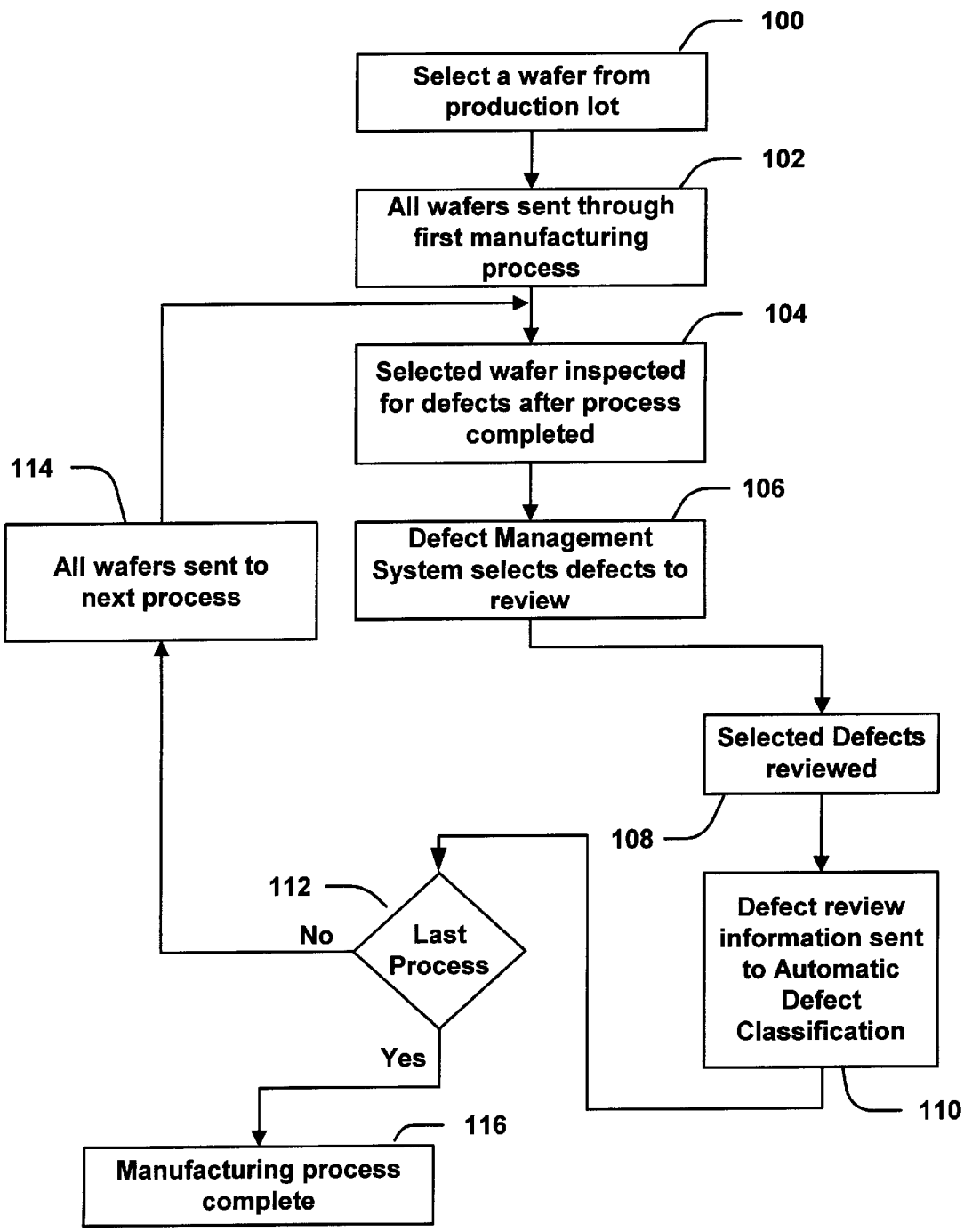
FIG. 1 is a flow diagram describing the movement of a selected wafer through all the processes in the manufacture of semiconductor devices.

FIG. 1 is a flow diagram describing the movement of a selected wafer through all the processes in the manufacture of semiconductor devices. As is known in the semiconductor manufacturing art, a production lot of wafers can be any selected number of wafers. As is also known in the semiconductor manufacturing art, it is not practical to scan each wafer for defects because inspecting each wafer is extremely time consuming, manpower intensive and equipment intensive. Therefore, a small number of wafers are selected from each production lot to be representative of that production lot. In some cases, only one wafer from a production lot is selected to be tested. This wafer is scanned for defects after each manufacturing process that has been designated to be a process that will be tested. It is also noted that the wafer is not scanned after each process because this would also be time consuming, manpower and equipment intensive. It has also been shown that good results can be obtained by scanning the selected wafer only after certain designated processes. The selection of a wafer is indicated at 100. All wafers in the production lot are sent through the first manufacturing process as indicated at 102. After the first process is complete, the selected wafer is examined for defects at 104. As is known in the semiconductor manufacturing art, the total number of defects on a wafer could be larger than can be practically examined. For this reason, only a selected number of defects are selected for review. The selected defects are reviewed at 108 and the review information is sent to the Automatic Defect Classification at 110. The production lot is cycled to the next process as indicated at 112 and 114. After the last process is complete, the overall manufacturing process is complete as indicated at 116.

Figure 2:
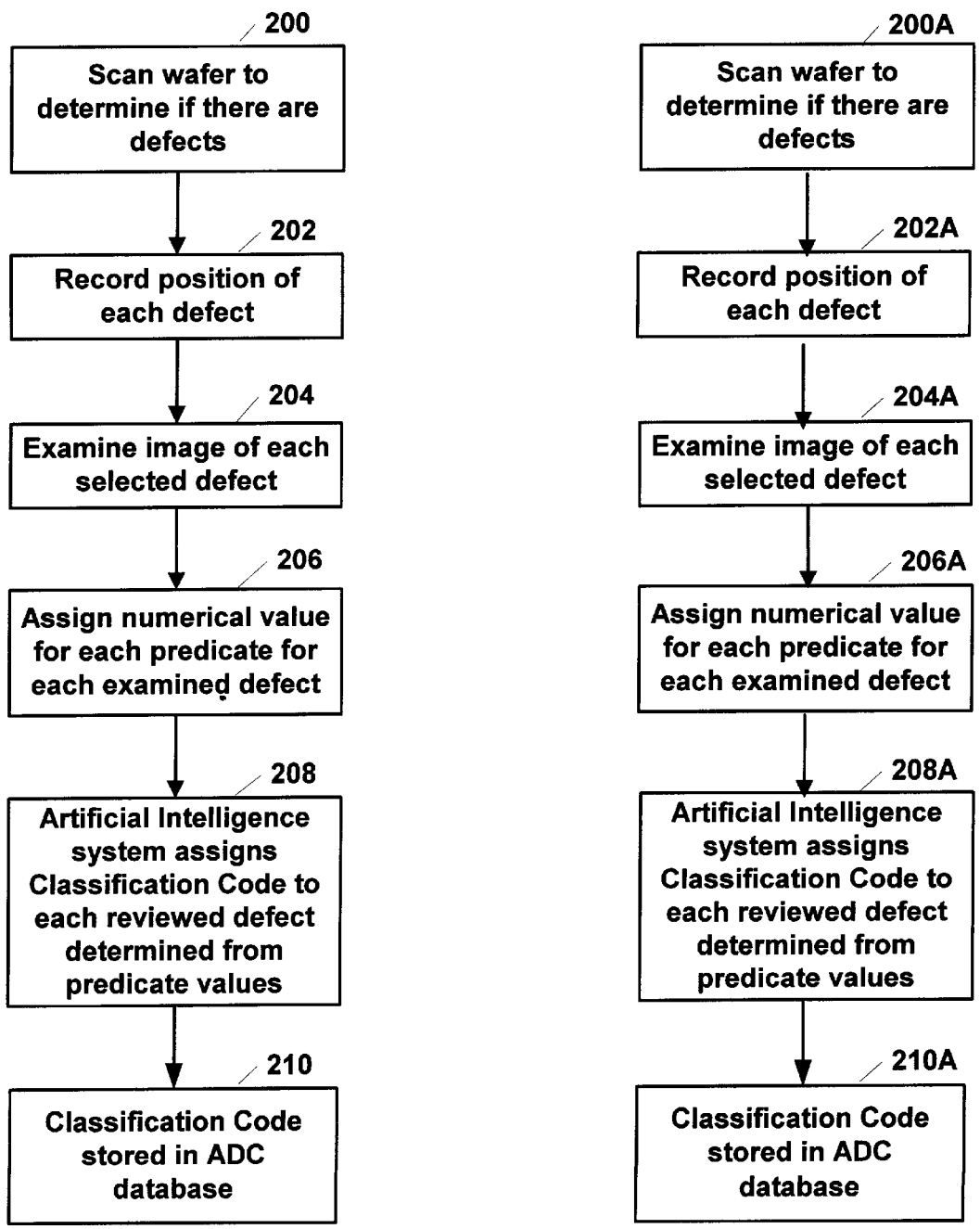
FIG. 2 is a flow diagram describing how two prior art automatic defect classification systems determines and stores classification codes for defects.

FIG. 2 is a detailed view of the process of assigning classification codes to defects as done in a typical prior art system that has at least two inspection tools. One of the inspection tools is represented by the portion of the flow diagram having process steps indicated from 200–210 and the second of the inspection tools is represented by the portion of the flow diagram having process steps indicated from 200A–210A. If there is more than one wafer selected to be inspected, one wafer may be sent to the tool represented by the steps 200–210 and the other wafer may be sent to the tool represented by the steps 200A–210A. The position of each defect is recorded, as indicated at 202 and 202A, so that the defect can be viewed by another tool such as an imaging tool. As discussed above, the number of defects on the selected wafer or selected wafers may be too large to allow each defect to be examined. For this reason, a given number of defects are selected for further review. An image is made of each selected defect and the images of the selected defects are examined, indicated at 204 and 204A. Each image has particular quantifiable qualities and properties that can be specified by elemental descriptor terms called predicates. These predicates are general descriptors such as roundness, brightness, color, hue, graininess, etc. There are N number of predicates and N can be 40–60 or more, or in some cases N can be less than 40. Each predicate can be assigned a value from a range of values, as indicated at 206 and 206A. A typical system can have values that can be assigned each predicate that range from 1 to 256. Other ranges are possible. If the range is from 1 to 256, a value of 1 means that none of the quality is present and a value of 256 means that the quality is ideal. For example, a line would have an assigned value of 1 for the quality of roundness, whereas a circle would have an assigned value of 256. The predicates are used in combination to uniquely describe defect types, in such a manner that a single classification code can be assigned to a defect that has been differentiated from all other defect types. The classification codes are assigned by an artificial intelligence system that has been programmed by the system administrator or engineer, as indicated at 208 and 208A. Various combinations and permutations of the N number of predicates are programmed to give a highly significant statistical confidence that the probability that the defect, and all other defects of the same type or class, will be assigned the same classification code. This is done by performing a best-fit calculation against all assigned classification codes. If the fit does not meet a pre-assigned quality standard an "unknown" code will be assigned, which means that the system needs further training for that particular type of defect. The prior art system shown in FIG. 2 stores the classification code for each defect and discards all of the predicate values.

Figure 3:
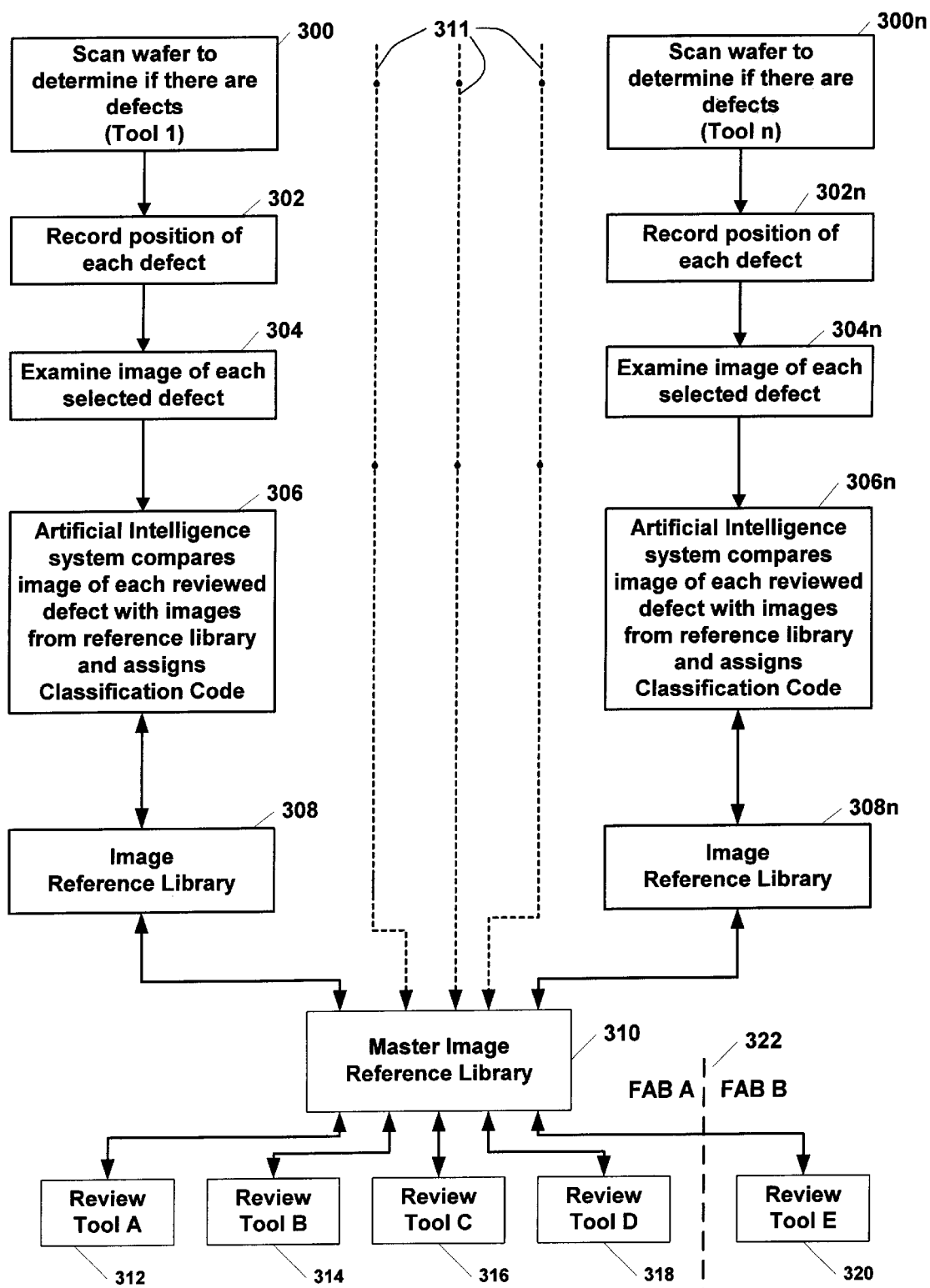
FIG. 3 is a flow diagram illustrating how a master image reference library in accordance with the present invention is associated with different inspection tools and ADC systems such as the systems shown in FIG. 2.

FIG. 3 is a flow diagram illustrating how a master image reference library in accordance with the present invention is associated with different inspection tools and ADC systems such as the systems shown in FIG. 2. FIG. 3 is intended to illustrate that a n number of tools can be used in accordance with the present invention. The first inspection tool is represented by the flow diagram having process steps indicated from 300–310 and the nth inspection tool is represented by the flow diagram having process steps indicated from 300n–310n. The dashed lines 311 represent other inspection tools that may be used.

The selected wafer or selected wafers are scanned to determine if there are defects, indicated at 300 and 300n. The position of each defect is recorded, as indicated at 302, so that the defect can be viewed by another tool such as an imaging tool. As discussed above, the number of defects on the selected wafer may be too large to allow each defect to be examined. For this reason, a given number of defects are selected for further review. An image is made of each selected defect and the images of the selected defects are examined, indicated at 304 and 304n. An artificial intelligence system compares the image, at 306 and 306n, of each of the selected defects with images that have been stored in an image reference library 308 and 308n. The images that are stored in the image reference library are the best images that have been previously obtained to represent a certain type of defect. The images in each image reference library, 308 through 308n, are updated with images from the master image reference library 310. The master image reference library maintains the best images for each type of defect. The master image reference library obtains images from all the image reference libraries, 308 through 308n. The images in the master image reference library are available for review by the review tools 312 through 320. The review tools 312 through 320 can be from different manufacturers or be different models from the same manufacturer as indicated by the labels "A" through "E". The best images are selected at the review tools 312 through 320, which are converted to a format system readable by all the image reference libraries and stored in the master image reference library. The master image reference library updates all of the image reference libraries 308 through 308n with the best images for each type of defect. The dashed line 322 indicates the versatility of the present invention in that the common format of the master image reference library 310 is usable by other facilities that use the same process technology. The data from the master image reference library 310 can be used to start up a new facility. This avoids the necessity of establishing a new database of images from the tools in the new facility.

After the images from the selected defects are compared to the images in the image reference library 308 through 308n a classification code is assigned to the defect.

The considerations and benefits of storing the images in a master image reference library in a common format are as follows:

1. It provides the ability for remote review stations that may be of different types from different manufacturers to review the images from all types of inspection tools.

2. It allows a single standard to exist within a fabrication facility thus reducing error and misclassification.

3. It provides a central location for all ideal defect images for ease of editing, updating and general maintenance.

4. It provides a database that may be used by other fabrication facilities using the same process technology for setting up an ADC within that facility.

5. It provides a method to bring a new inspection tool on line by having ideal images available to update the new tools image reference library.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of determining classification codes for defects occurring in semiconductor manufacturing processes, the method comprising:

sending a production lot of wafers through a first manufacturing process;

scanning a selected wafer from the production lot in a first inspection tool to identify defects on the selected wafer;

selecting defects from the identified defects on the selected wafer to review;

forming images of the selected defects on the selected wafer;

comparing the images of the selected defects on the selected wafer with defect images formed of defects previously identified in the first inspection tool and stored in a first image reference library; and determining a classification code for each selected defect on the selected wafer based upon the comparison of the images of the selected defects on the selected wafer with the defect images stored in the first image reference library.

2. The method of claim 1 further comprising:

sending the images of the selected defects on the selected wafer to a master image reference library; and updating the defect images stored in the first image reference library from the master image reference library, wherein the classification code for each selected defect is inspection tool independent.

3. The method of claim 2 further comprising:

scanning at least a second selected wafer from the production lot of wafers in a second inspection tool to identify defects on the at least a second selected wafer;

selecting defects from the identified defects on the at least a second selected wafer to review;

forming images of the selected defects on the at least a second selected wafer;

comparing the images of the selected defects on the at least a second selected wafer with defect images formed of defects previously identified in the second inspection tool and stored in a second image reference library;

determining a classification code for each selected defect on the at least a second selected wafer based upon the comparison of the images of the selected defects on the at least a second selected wafer with the defect images stored in the second image reference library.

4. The method of claim 3 further comprising:

sending the images of the selected defects on the at least a second selected wafer to the master image reference library; and updating the defect images stored in the second image reference library, wherein the classification code for each selected defect is inspection tool independent.

* * * * *